United States Patent [19]
Thiel

[11] Patent Number: 5,959,243
[45] Date of Patent: Sep. 28, 1999

[54] MATING RING FOR A METER COVER AND BASE ASSEMBLY

[75] Inventor: Patrick L. Thiel, Raleigh, N.C.

[73] Assignee: ABB Power T&D Company Inc., Raleigh, N.C.

[21] Appl. No.: 09/008,690

[22] Filed: Jan. 16, 1998

[51] Int. Cl.⁶ .................................................. H05K 5/03
[52] U.S. Cl. .................. 174/17 CT; 361/667; 220/3.8
[58] Field of Search ................... 174/17 CT, 66; 361/659, 664, 667, 672; 220/241, 3.8

[56] References Cited

U.S. PATENT DOCUMENTS

| | | | |
|---|---|---|---|
| 3,628,096 | 12/1971 | Drew, Jr. et al. | 317/107 |
| 3,683,102 | 8/1972 | Moran et al. | 174/50 |
| 4,121,147 | 10/1978 | Becker et al. | 361/664 X |
| 4,146,258 | 3/1979 | Andruchiw | 292/256.6 |
| 4,747,016 | 5/1988 | Sloop, Sr. | 361/667 X |
| 5,048,881 | 9/1991 | Renfro | 292/320 |
| 5,088,004 | 2/1992 | Howell | 361/672 X |
| 5,385,486 | 1/1995 | Robinson et al. | 361/659 X |
| 5,473,504 | 12/1995 | Horan et al. | 361/667 |
| 5,499,159 | 3/1996 | Gatz | 361/667 |
| 5,704,804 | 1/1998 | Robinson et al. | 361/659 X |

*Primary Examiner*—Dean A. Reichard
*Attorney, Agent, or Firm*—Woodcock, Washburn, Kurtz, Mackiewcz & Norris LLP

[57] ABSTRACT

There is disclosed a plastic mating ring for a meter cover and base assembly. The mating ring includes provisions for attaching the meter cover to the mating ring and the mating ring also includes provisions for reducing distortions of the cylindrical wall of the mating ring when the ring is pulled tight against the edge of the meter cover during twisting of the cover onto the meter base.

5 Claims, 5 Drawing Sheets

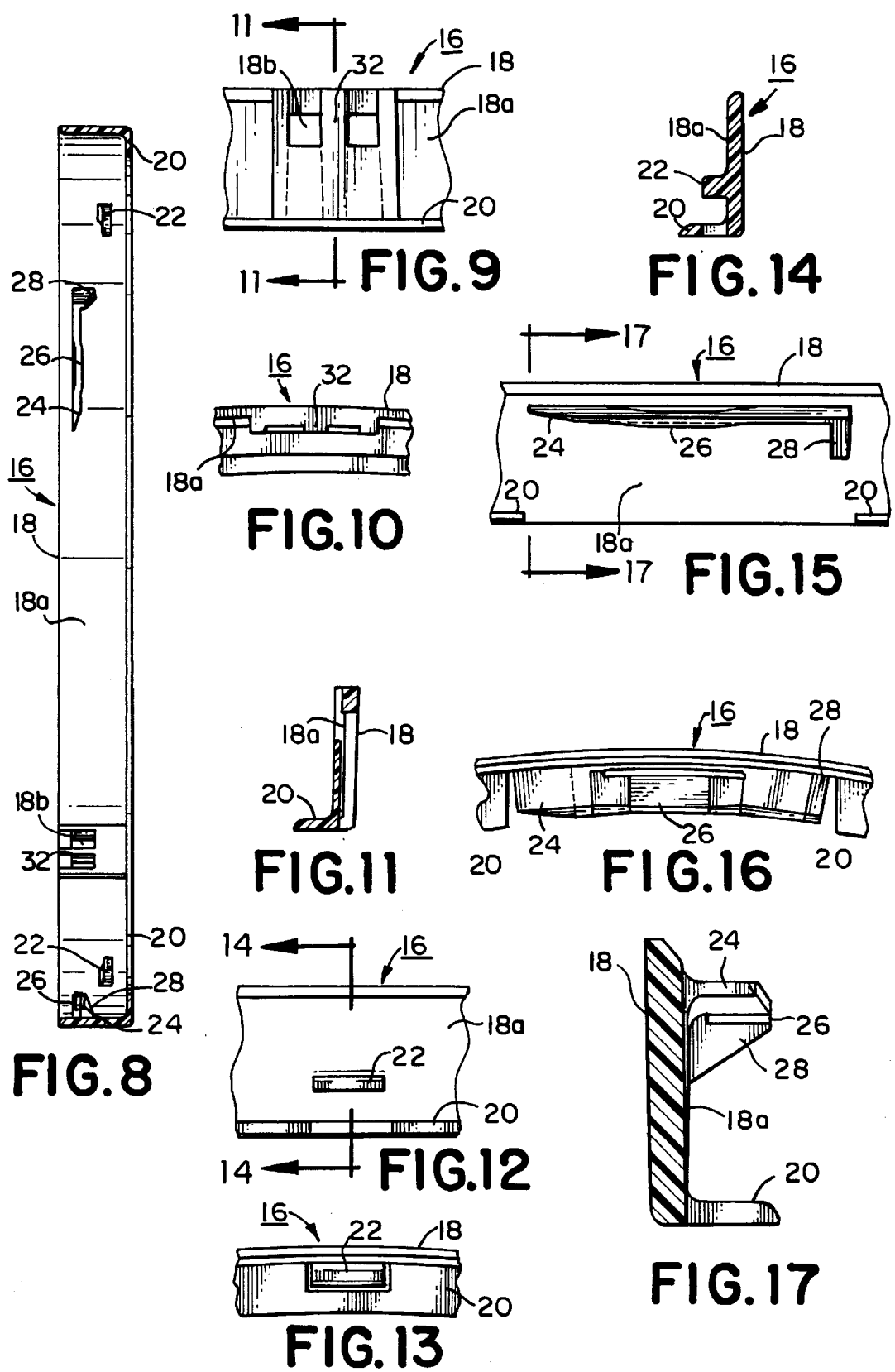

MATING RING FOR A METER COVER AND BASE ASSEMBLY

BACKGROUND OF THE INVENTION

1. Field of the Invention

This invention relates to a meter cover and meter base assembly for an electric meter and particularly to a plastic mating ring for mounting the meter cover onto the meter base. The invention is particularly suitable for an electric induction watthour meter.

2. Description of the Prior Art

For many years, a stainless steel ring has been used to attach the molded glass cover to the base of a single phase watthour meter. The circular flanged ring is assembled to the cover by welding clips onto the ring. During the welding process, the cover which is part of the assembly, is proned to breakage due to the forces applied to the metal parts to keep them on location and heat generated during welding. Large variations in the dimensions of the molded cover also aggravate the assembly process causing non-uniform loading to be applied to the glass. Metal rings, being made from thin coil stock, have sharp edges which can cause injury to a person when assembling the cover onto the base or the insertion of the complete meter into the socket. Upon installation of the meter in the field, the installer takes the meter and inserts it into a socket and then places a "U-shaped' sealing ring around the perimeter of the cover flange, ring and base. To make sure that the sealing ring fits over the assembly, the diameter and height build up the meter, ring and base are dimensioned to meet specific ANSI-limits. The sealing ring also has ANSI values limiting its size. Any change in the design of the ring, cover or base may adversely impact the fit of the sealing ring over the assembly.

It has heretofore been proposed to replace the metal rings with a plastic mating ring for mounting a meter cover to a meter base. An example of such plastic mating ring is disclosed in U.S. Pat. No. 5,499,159. While such plastic rings have been successful, nevertheless they have left something to be desired. When a plastic ring is used, it must be of sufficient strength so that it cannot be broken or be too flexible so that it can be pulled off the cover when the meter is being removed from the socket. The design of the plastic ring must be adequate to compensate for the variation in the thickness build up of the cover, base and gasket to provide both sealing of the gasket and limit the torque required to turn the ring-cover assembly onto the base. Additionally, the dimensional build up from the top of the ring to the bottom of the base should not exceed ANSI limits and the diameter of the ring cannot exceed ANSI limits.

SUMMARY OF THE INVENTION

It is an object of the present invention to provide a plastic mating ring for a meter cover and meter base assembly which has sufficient strength so as not to be broken nor is too flexible to be pulled off the cover when the meter is being removed from the socket. The design of the ring also compensates for the variation in the build up of the cover, base and gasket to provide both sealing of the gasket and limit the torque required to turn the ring-cover assembly onto the base.

In accordance with the present invention there is provide in a meter cover and base assembly, a mating ring for mounting a meter cover onto the meter base in which the meter cover includes an annular flange at its open end and the meter base includes a circular perimeter having a plurality of inclined base locking lugs equally distributed there around adjacent areas cut back from the circular perimeter of the base. The mating ring is a circular plastic ring having an "L-shaped" cross section for mating with the annular flange of the meter cover, the circular ring including a cylindrical wall having an inner surface and a plurality of ring flanges projecting radially inward from the inner surface to form the "L-shaped" cross section. A plurality of locking tabs project from the inner surface of the cylindrical wall and oppose the plurality of ring flanges. Each of the locking tabs defines a retaining surface directed toward the ring flanges and spaced apart therefrom to receive the annular flange of the meter cover between the ring flanges and the locking tabs to attach the circular ring to the annular flange of the meter cover. A base attachment means is defined on the inner surface of the cylindrical wall removably attaching the circular ring to the meter base. The base attachment means includes a plurality of ring locking lugs projecting inwardly from the inner surface of the cylindrical wall, each of the ring locking lugs being located between the ends of adjacent ring flanges and spaced between the edges of the cylindrical wall, each of the locking lugs being shaped to extend through the respective areas cut back in the circular perimeter of the base to allow the ring locking lugs of the circular ring to fit over the base perimeter. Each ring locking lug includes a flexible section shaped to ride up the incline on the mating base locking lug when the glass cover with the circular ring attached is twisted for assembly with the mating base thereby causing the ring locking lug to bear up against the mating base locking lug with increasing force as the cover is turned until the top of the incline on the base locking lug is reached, whereby the flexible section of each rim locking lug cooperates with the mating base locking lug to maintain the contact force therebetween constant. A plurality of interference pads project inwardly from the inner surface of the cylindrical wall, each of the interference pads between located between adjacent ring locking lugs for engaging the periphery of the annular flange of the meter cover thereby reducing distortion of the cylindrical wall when the circular plastic ring is pulled tight against the cover during twisting of the cover onto the meter base.

For a more detailed disclosure of the invention and for further objects and advantages thereof, reference is to be had to the following description taken in conjunction with the accompanying drawings.

BRIEF DESCRIPTION OF THE DRAWINGS

FIG. 8 is a sectional view of the plastic mating ring taken along the lines 8—8 in FIG. 6.

FIG. 9 is a fractional elevational view taken along the lines 9—9 in FIG. 6.

FIG. 10 is a top plan view of FIG. 9.

FIG. 11 is a sectional view taken along the lines 11—11 in FIG. 9.

FIG. 12 is a fractional elevational view taken along the lines 12—12 in FIG. 6.

FIG. 13 is a top plan view of FIG. 12.

FIG. 14 is a sectional view taken along the lines 14—14 in FIG. 12.

FIG. 15 is a fractional elevational view taken along the lines 15—15 in FIG. 6.

FIG. 16 is a top plan view of FIG. 15.

FIG. 17 is a sectional view on enlarged scale taken along the lines 17—17 in FIG. 15.

DESCRIPTION OF THE PREFERRED EMBODIMENT

Figure 1:
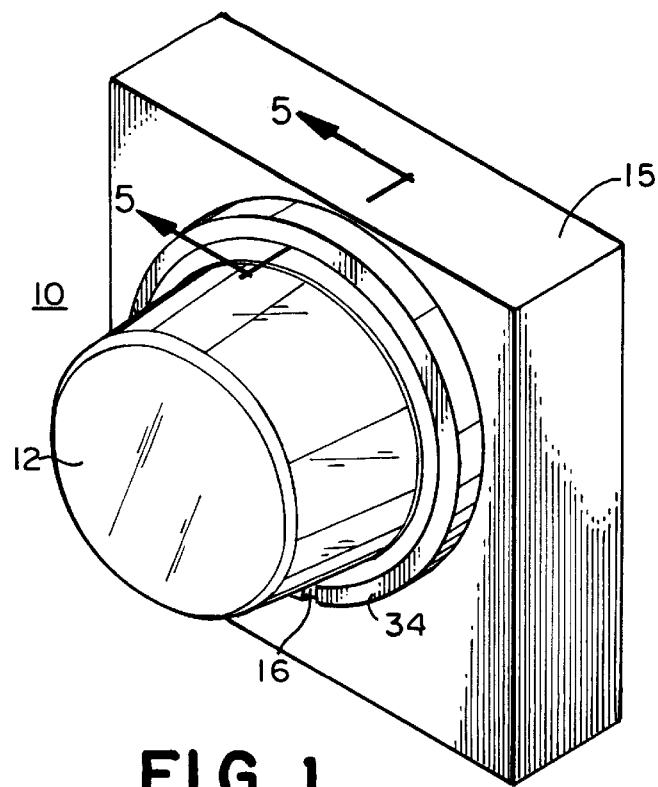
FIG. 1 is a perspective view of an electric meter assembly embodying the present invention.
Figure 5:
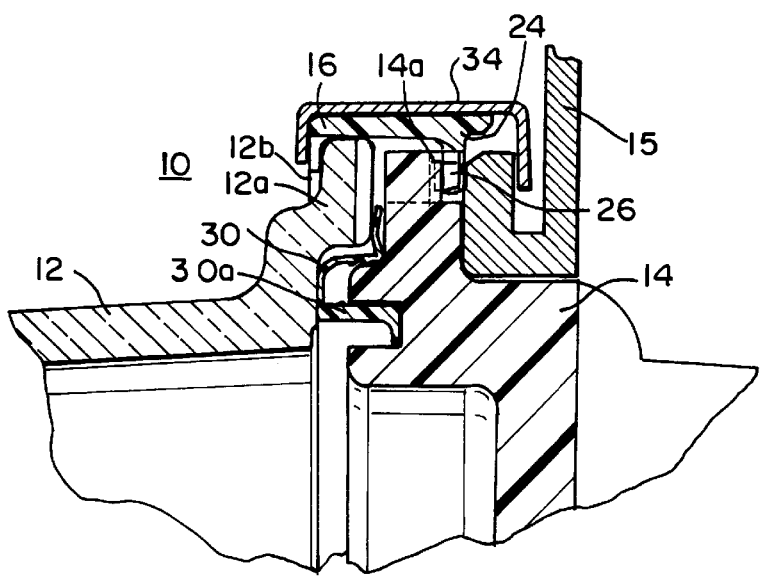
FIG. 5 is a sectional view on enlarged scale taken along the lines 5—5 in FIG. 1.
Figure 2:
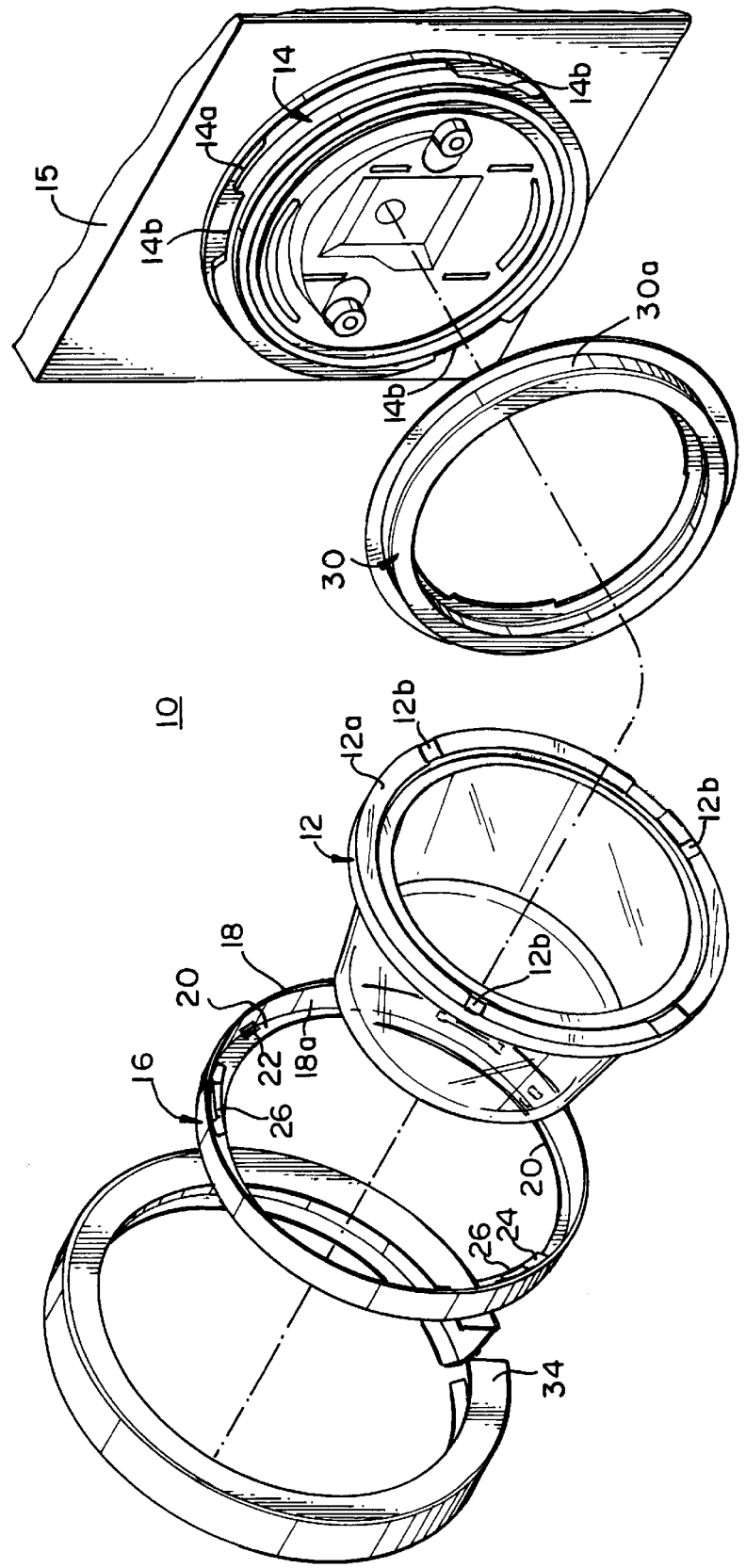
FIG. 2 is an exploded view of the electric meter assembly illustrated in FIG. 1 showing the meter cover, meter base and plastic mating ring.
Figure 3:
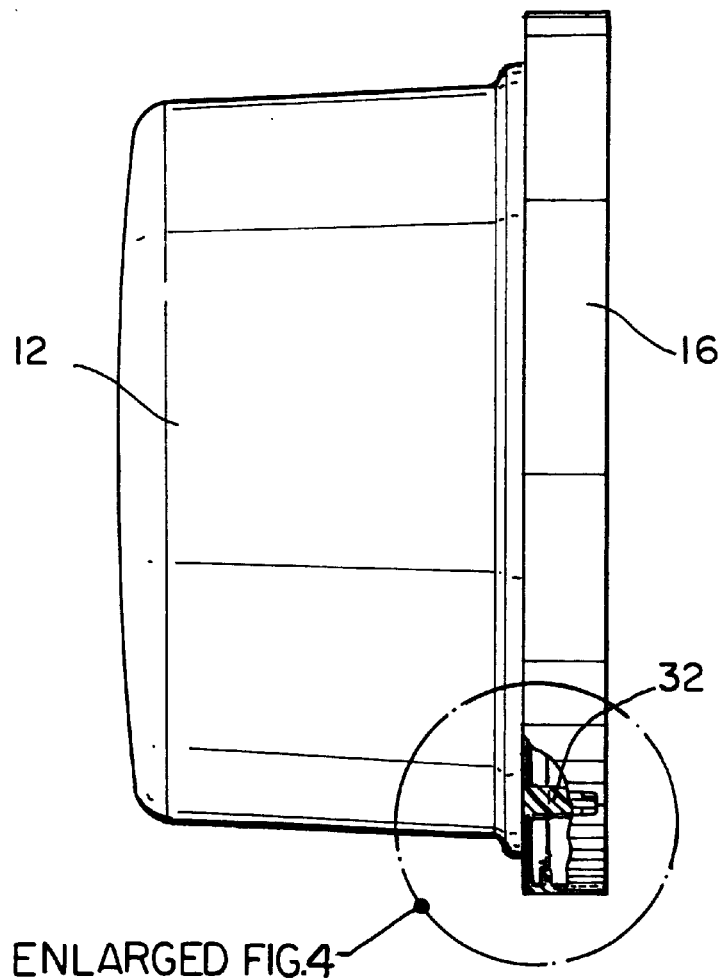
FIG. 3 is a side elevation of the cover and plastic mating ring embodying the present invention.
Figure 4:
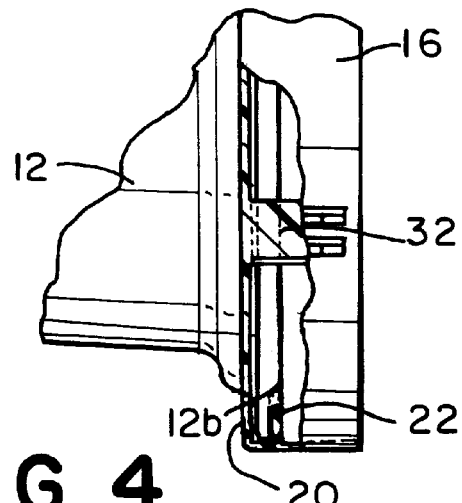
FIG. 4 is an enlargement of the cut away portion illustrated in FIG. 3.

Referring to the drawings, FIGS. 1, 2 and 5 show an electric meter assembly 10 wherein a cup-shaped cover 12 cooperates with a base unit 14 to define and enclosure within which an electric meter (not shown) is located. The plastic mating ring 16, FIGS. 1 and 5, mounts the meter cover 12 onto the meter base 14 for insertion of the meter into a conventional cup-shaped mounting socket 15. The meter cover 12 includes an annular flange 12a at its open end and the meter base 14 includes a circular perimeter having a plurality of inclined base locking lugs 14a (preferably three) equally distributed around adjacent areas 14b cut back from the circular perimeter of the base 14. The mating ring 16 FIGS. 2 and 6, comprises a circular plastic ring having an "L" shaped cross-section for mating with the annular flange 12a of the meter cover 12. The circular ring 16 includes a cylindrical wall 18 having an inner surface 18a and a plurality of ring flanges 20, preferably three, projecting radially inward from the inner surface 18a to form the "L" shaped cross section, FIG. 14.

Figure 6:
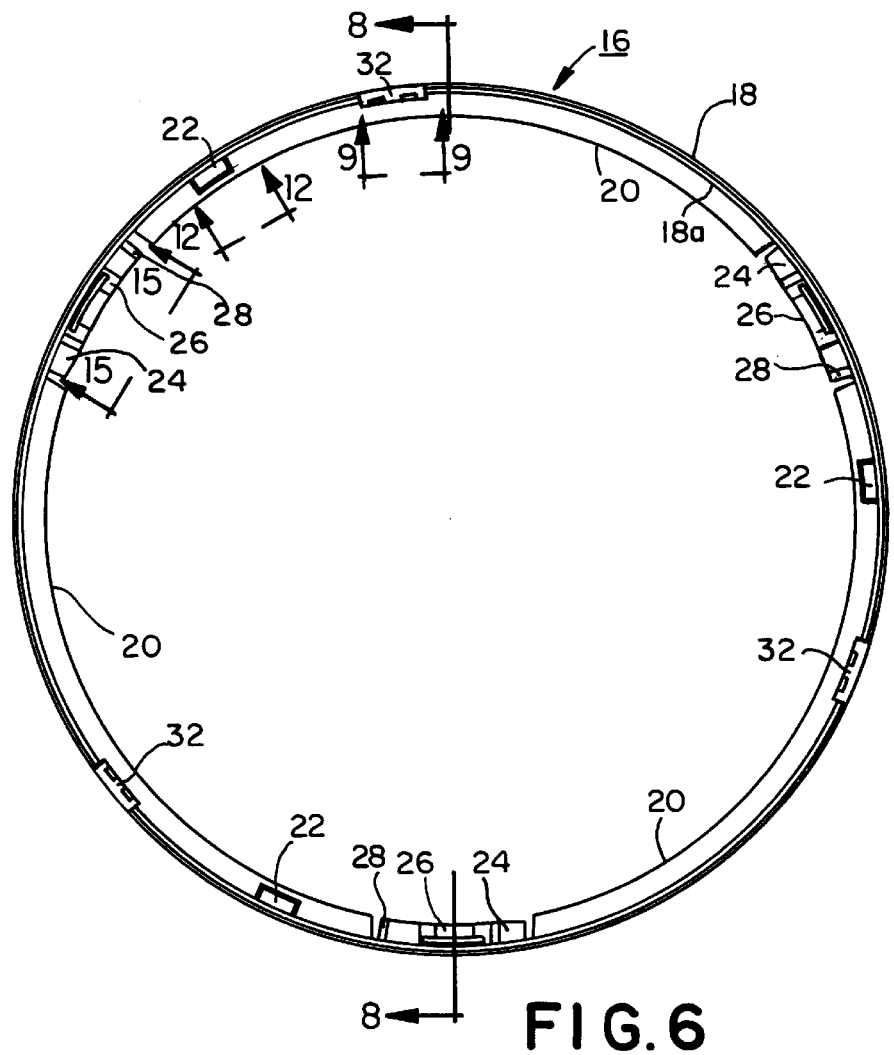
FIG. 6 is a rear view of the plastic mating ring shown in FIG. 3.
Figure 7:
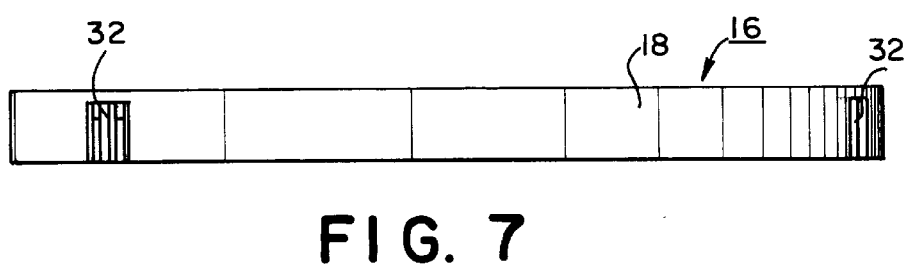
FIG. 7 is a side elevation of the plastic mating ring shown in FIG. 6.

A plurality of locking tabs 22, preferably three, FIGS. 2 and 6, project from the inner surface 18a of the cylindrical wall 18 and oppose the plurality of ring flanges 20, FIG. 14. Each of the locking tabs 22 define a retaining surface directed toward the ring flanges 20, FIGS. 8, 12 and 13 and are spaced apart therefrom to receive therebetween the annular flange 12a of the meter cover 12 to attach the circular ring 16 to the annular flange 12a of the meter cover 12. The flange 12a of the cover includes a plurality of notches or recesses 12b of reduced thickness corresponding to the plurality of locking tabs 22. The locking tabs 22 are shaped to fit within the notches 12b, FIGS. 2 and 5, in the annular flange of the meter cover whereby the annular flange 12a of the meter cover snaps between the locking tabs 22 and the ring flanges 20 to attach the mating ring 16 to the annular flange 12a of the meter cover 12 and prevent rotation of the mating ring 16 with respect to the meter cover 12.

The inner surface 18a of the cylindrical wall 18 of the mating ring 16 is provided with base attachment means for removably attaching the mating ring 16 to the meter base 14. The base attachment means includes a plurality of ring locking lugs 24, preferably three, projecting inwardly from the inner surface 18a of the cylindrical wall 18, FIG. 2. Each of the ring locking lugs 24, FIG. 6, is located between the ends of adjacent ring flanges 20 and spaced from the edges of the cylindrical wall 18. Each of the ring locking lugs 24 is shaped to extend through the respective areas 14b, FIG. 2, cut back on the circular perimeter of the base 14 to allow the ring locking lugs 24 of the mating ring 16 to fit over the perimeter of the base 14. Each of the ring locking lugs 24, FIGS. 6, 8, 15–17, includes a flexible section 26 shaped to ride up the incline of the mating base locking lug 14a when the glass cover 12 with the circular mating ring 16 attached is twisted for assembly with the mating base 14. This causes the ring locking lugs 24 to bear up against the mating base locking lug 14a with increasing force as the cover 12 is turned until the top of the incline of the base locking lug is reached. The flexible section 26 of each rim locking lug 24 cooperates with the mating base locking lug 14a to maintain the contact force therebetween constant. The magnitude of the contact force and resulting torque to twist the cover 12 onto the base 14 is dependent upon the build up of parts making up the assembly. As may best be seen in FIG. 5 the build up of parts includes the flange 12a of the cover 12, the ramp 14a on the base 14 and the gasket 30 that is inserted therebetween. The glass cover 12, the base 14 and the vertical section 30a of the gasket 30 are quite rigid and have high spring constant. To allow the maximum twisting torque for the cover to be maintained at a reasonable level, the ring locking lugs 24 include the flexible section 26 shaped in the form of a ramp having an abutment 28 at one end thereof to limit the turning movement of the cover 12. When the build up of parts is large the flexible portion 26 of the lug 24 deflects so the force is kept to a manageable level thereby limiting the torque required to overcome the frictional component of the force. The opposite is also true, i.e., when the build up of parts is small, the flexible ramp 26 applies at least a small force so that the cover 12 is not loose on the meter base. If the cover 12 is loose, it is possible for dust and insects to get into the meter and over the sealing gasket. The flexible portion 26 of the locking tab 24 minimizes the range between low and high level torque required to place the cover and rim assembly 12, 16 onto the base 14.

As may be seen in FIG. 6 a plurality of interference pads 32, preferably three, project inwardly from the inner surface 18a of the cylindrical wall 18 of ring 16. Each of the interference pads 32 is located between adjacent ring locking lugs 22 for engaging the periphery of the annular flange 12a of the meter cover 12 in the assembly. The pads 32 cause the plastic mating ring 16 to project out slightly from the rim 12a of the cover 12 at each pad location. The interference pads 32 are positioned along the perimeter of the inner surface 18a of the cylindrical wall 18 in such a manner that the areas where the locking lugs 24 are located are pulled tight against the circumference of the cover flange 12a. Any frictional resistance at the locking lugs 24 producing a twisting torque causes the outside surface of the cylindrical wall 18 of rim 16 to become distorted. The action of the interference pads 32 reduces this distortion because the rim 16 is pulled taught and is tight against the periphery of the cover rim 12a. It is desirable to maintain the fit of the inside diameter of the plastic mating ring 16 and the outside diameter of the cover rim 12a within close limits. If the mating ring 16 is too large (or the cover too small), the ring can easily be pushed off the cover. Likewise if the ring 16 is too small, or the cover 12 too large, the ring either cannot be assembled onto the cover or it will be extremely tight. If for some reason a change occurs in the diameter of production parts in either the mating ring 16 or the cover 12, the thickness of the interference pads 32 can be modified quickly to correct the fit between the two parts. Without this capability, a major modification may be required in the tooling of the offending part.

Upon installation of the electric meter in the field, the installer takes the meter with the cover and base assembled as described above and inserts it into a socket 15, FIG. 1, and places a split "U" shaped metal sealing ring 34 around the perimeter of the cover flange 12*a*, mating ring 16 and base 14. An opening 18*b*, FIGS. 8 and 9 in the side wall 18 of the mating ring 16 is provided to allow insertion of a meter seal, not shown, through the side of the ring 16 into the base 14 to identify potential tampering of the meter.

From the foregoing it will be seen that the present invention provides a mating ring for assembling a meter cover onto a base with a sealing gasket in place. The mating ring is of sufficient strength to avoid being broken and is not too flexible so as to be pulled off the cover when the meter is being removed from the socket. The mating ring include structural provisions to compensate for the variation in the build up of the cover, base and gasket to provide both sealing of the gasket and limit the torque required to turn the ring/cover assembly onto the base While there has been described a preferred embodiment of the invention, it will be understood that further modifications may be made without departing from the spirit and scope of the invention as set forth in the appended claims.

What is claimed is:

1. In a meter cover and meter base assembly, a mating ring mounting a meter cover onto a meter base in which the meter cover includes an annular flange at its open end and the meter base includes a circular perimeter having a plurality of inclined base locking lugs equally distributed there around adjacent areas cut back from the circular perimeter of the base, the mating ring comprising:

a circular plastic ring having an "L" shaped cross section for mating with the annular flange of the meter cover, said circular ring including a cylindrical wall having an inner surface and a plurality of ring flanges projecting radially inward from said inner surface to form said "L" shaped cross section, a plurality of locking tabs projecting from the inner surface of said cylindrical wall and opposing said plurality of ring flanges, each of said locking tabs defining a retaining surface directed toward said ring flanges and spaced apart therefrom to receive the annular flange of the meter cover between said ring flanges and said locking tabs to attach said circular ring to the annular flange of the meter cover, base attachment means defined on said inner surface of said cylindrical wall removably attaching said circular ring to a meter base, said base attachment means including a plurality of ring locking lugs projecting inwardly from the inner surface of said cylindrical wall, each of said ring locking lugs being located between the ends of adjacent ring flanges and spaced between edges of the cylindrical wall, each of said locking lugs being shaped to extend through the respective areas cut back on the circular perimeter of the base to allow the ring locking lugs of the circular ring to fit over the base perimeter, each said ring locking lug including a flexible section shaped to ride up the incline on a corresponding one of the base locking lugs when the meter cover with the circular ring attached is twisted for assembly with the base thereby causing the ring locking lug to bear up against the corresponding one of the base locking lugs with increasing force as the cover is turned until a top of the incline on the base locking lug is reached, whereby said flexible section of each rim locking lug cooperates with the mating base locking lug to maintain the contact force therebetween constant, and a plurality of interference pads projecting inwardly from the inner surface of said cylindrical wall, each of said interference pads being located between adjacent ones of said ring locking lugs for engaging the periphery of the annular flange of the meter cover thereby reducing distortion of said cylindrical wall when said circular plastic ring is pulled tight against the cover during twisting of the cover onto the meter base.

2. In a meter cover and meter base assembly according to claim 1 wherein the annular flange of the meter cover includes a plurality of notches of reduced thickness corresponding to the plurality of locking tabs and wherein said locking tabs are shaped to fit within the notches of reduced thickness in the annular flange of the meter cover whereby the annular flange of the meter cover snaps between the locking tabs and said ring flanges to attach the cylindrical wall of the mating ring to the annular flange of the meter cover and prevent rotation of the mating ring relative to the meter cover.

3. In a meter cover and meter base assembly according to claim 1 including an annular gasket positioned between the annular flange of the meter cover and the mating base.

4. In a meter cover and meter base assembly according to claim 1 wherein said circular plastic ring has at least one opening in the cylindrical wall for insertion of a meter seal through the wall of the circular plastic ring into the mating base to identify potential tampering of the meter.

5. In a meter cover and meter base assembly according to claim 1 wherein each said ring locking lug including said flexible section is shaped in the form of a ramp having an abutment at one end thereof to limit the turning movement of the cover.

* * * * *